United States Patent
Chakraborty

(10) Patent No.: US 9,530,486 B1
(45) Date of Patent: Dec. 27, 2016

(54) ADAPTIVE TECHNIQUE FOR ADJUSTING SIGNAL DEVELOPMENT ACROSS BIT LINES FOR READ OPERATION ROBUSTNESS IN MEMORY CIRCUITS

(71) Applicant: Lattice Semiconductor Corporation, Portland, OR (US)

(72) Inventor: Kanad Chakraborty, Portland, OR (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/876,862

(22) Filed: Oct. 7, 2015

(51) Int. Cl.
  *G11C 11/419* (2006.01)

(52) U.S. Cl.
  CPC .................... *G11C 11/419* (2013.01)

(58) Field of Classification Search
  CPC .............. G11C 11/419; G11C 7/065
  USPC ................................ 365/156, 205
  See application file for complete search history.

(56) References Cited

U.S. PATENT DOCUMENTS

| | | | | |
|---|---|---|---|---|
| 8,848,419 | B2* | 9/2014 | Wu ........ | G11C 11/419 365/148 |
| 2014/0043886 | A1* | 2/2014 | Wu ........ | G11C 11/419 365/148 |
| 2015/0063007 | A1* | 3/2015 | Choi ....... | G11C 11/419 365/154 |
| 2015/0279434 | A1* | 10/2015 | Chang ....... | G11O 5/10 365/63 |

OTHER PUBLICATIONS

Taehiibg Song, et al. "13.2 A 14nm FinFET 128Mb 6T SRAM with V MIN-Enhancement Techniques for Low-Power Applications." Solid-State Circuits Conference Digest of Technical Papers (ISSCC), 2014 IEEE International. IEEE, 2014.pp. 232-233.
Kanad Chakraborty, et al., "A Physical Design Tool for Built-In Self-Repairable RAMs," Very Large Scale Integration (VLSI) Systems, IEEE Transactions on 9.2 (2001), pp. 352-364.
Philipp Öhler, et al., "An Integrated Built-In Test and Repair Approach for Memories with 2D Redundancy." Test Symposium, 2007. ETS'07. 12th IEEE European. IEEE, 2007.
Lei Wang, "Error-Tolerance Memory Microarchitecture via Dynamic Multithreading Redundancy." Computer Design: VLSI in Computers and Processors, 2005. ICCD 2005. Proceedings. 2005 IEEE International Conference on. IEEE, 2005, 6 pages.
Jae Chul Cha et al., "Characterization of granularity and redundancy for SRAMs for optimal yield-per-area." Computer Design, 2008. ICCD 2008. IEEE International Conference on. IEEE, 2008, pp. 219-226.

* cited by examiner

*Primary Examiner* — Michael Tran

(57) ABSTRACT

In one embodiment, a memory array has a pair of bit lines for each column of 1-bit SRAM cells and a word line for each row of cells, where, during a memory read operation, the bit value stored in each cell is detectable by sensing a voltage difference developed between the corresponding bit line pair. A first signal-development circuit is coupled to one bit line to accelerate draining that bit line of charge if a first bit value is stored in the cell, and a second signal-development circuit is coupled to the other bit line to accelerate draining that other bit line of charge if a second, different bit value is stored in the cell. Pulldown devices are provided to ensure that the signal-development circuit operate properly during the pre-charge and voltage difference development phases of the memory read operation, which is now faster due to the signal-development circuits.

14 Claims, 2 Drawing Sheets

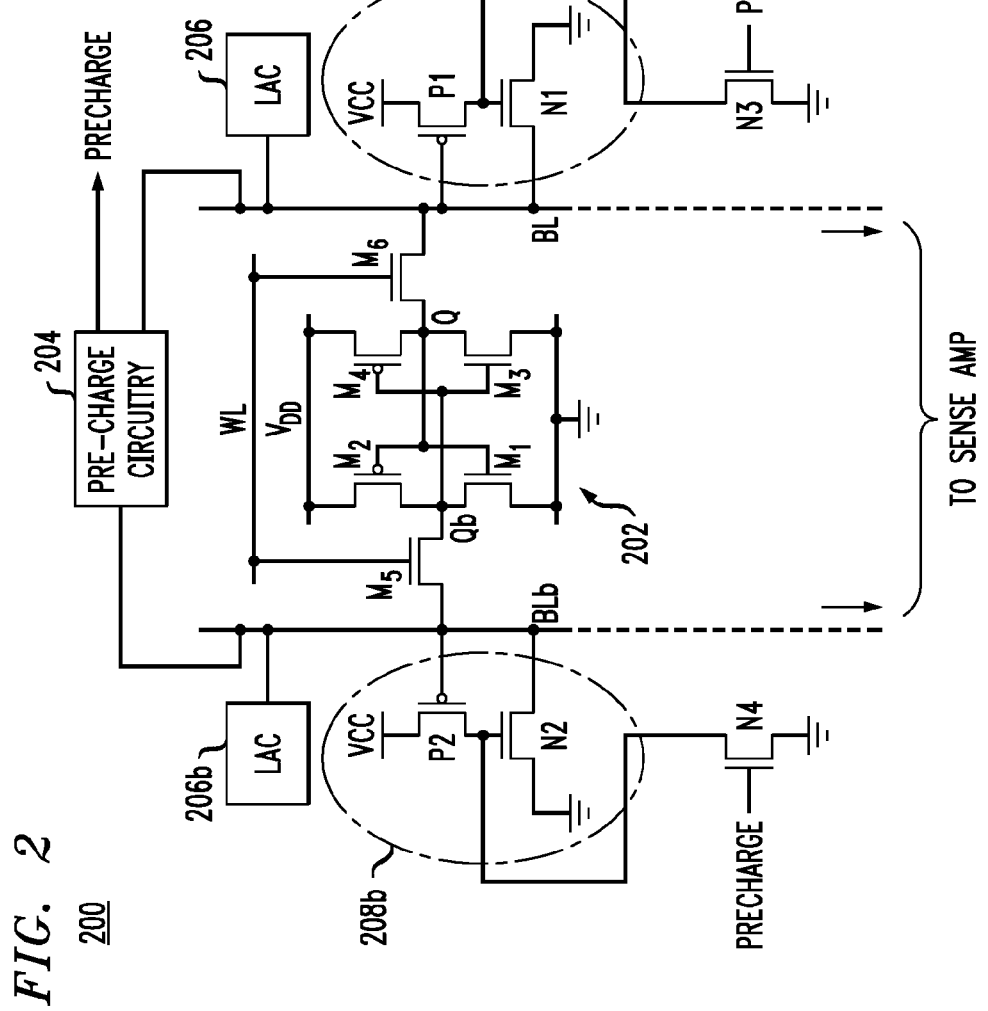

ADAPTIVE TECHNIQUE FOR ADJUSTING SIGNAL DEVELOPMENT ACROSS BIT LINES FOR READ OPERATION ROBUSTNESS IN MEMORY CIRCUITS

BACKGROUND

Field of the Invention

The present invention relates to electronics and, more specifically, to voltage signal development across bit lines during a read operation for memory circuitry such as static random access memory (SRAM) circuitry.

Description of the Related Art

This section introduces aspects that may help facilitate a better understanding of the invention. Accordingly, the statements of this section are to be read in this light and are not to be understood as admissions about what is prior art or what is not prior art.

FIG. 1 is a simplified schematic circuit diagram of a portion of a conventional memory array 100 comprising a two-dimensional array of 1-bit SRAM memory cells 102 arranged in rows and columns, of which only one example cell is shown in FIG. 1. As represented in FIG. 1, each cell 102 comprises six transistor devices M1-M6 which are coupled to a word line WL and a pair of bit lines: bit line BL and bit bar line BLb. Each column of the memory array has its own bit line pair BL and BLb, and each row of the memory array has its own word line WL. All of the cells 102 in each column are coupled to the same bit line pair BL and BLb, which are in turn coupled to sense amplifier circuitry (not shown) for that column, and all of the cells 102 in each row are coupled to the same word line WL.

In a "logic 1 high" interpretation, a bit value of 1 is said to be stored in cell 102 if node Q is high and node Qb is low. In that case, devices M1 and M4 will be on, and devices M2 and M3 will be off. On the other hand, a bit value of 0 is said to be stored in cell 102 if node Q is low and node Qb is high. In that case, devices M1 and M4 will be off, and devices M2 and M3 will be on.

The sequence of operations to read the bit value stored in cell 102 is as follows: First, with the word line WL driven low, pre-charge circuitry 104 is turned on (or enabled or coupled, depending on the particular implementation) to pre-charge both the bit line BL and the bit bar line BLb to the same high voltage level. The pre-charge circuitry 104 is then turned off (or disabled or uncoupled, depending on the particular implementation), and, soon after, the word line WL is driven high to turn on devices M5 and M6. Note that the word lines WL of the other rows in the array stay low, such that the other cells 102 in the same column remain isolated from the bit line pair BL and BLb.

If cell 102 stores a bit value of 1, such that Q is high and Qb is low, then, if the word line WL is driven high, the pre-charged bit bar line BLb will be driven towards ground through turned-on devices M5 and M1, while the pre-charged bit line BL will stay high due to turned-on devices M6 and M4. This will result in the development of a positive voltage differential between the bit line BL and bit bar line BLb (i.e., the voltage of BL is greater than the voltage of BLb), which the sense amplifier circuitry will detect as a stored bit value of 1 in cell 102.

On the other hand, if cell 102 stores a bit value of 0, such that Q is low and Qb is high, then, if the word line WL is driven high, the pre-charged bit line BL will be driven towards ground through turned-on devices M6 and M3, while the pre-charged bit bar line BLb will stay high due to turned-on devices M5 and M2. This will result in the development of a negative voltage differential between the bit line BL and bit bar line BLb (i.e., the voltage of BL is less than the voltage of BLb), which the sense amplifier circuitry will detect as a stored bit value of 0 in cell 102.

In general, the faster the development of a voltage difference between bit lines BL and BLb of sufficient magnitude to be detected, the faster will the sense amplifier circuitry be able to read the stored bit value. In some cases, a slow development of a voltage difference between BL and BLb may cause failure of the sense amplifier to read the correct value.

One of the problems with memory arrays like memory array 100 of FIG. 1 is that leakage currents can slow down the speed at which data can be read from the memory array. In particular, leakage currents can draw charge from the pre-charged bit lines BL and/or BLb between the time that the pre-charge circuitry 104 is turned off and the time that the word line is driven high, such that one or both bit lines will be below its desired pre-charged voltage level.

For example, if cell 102 stores a bit value of 1, such that Q is high and Qb is low, leakage current in bit line BL will lower the voltage level of BL from its pre-charged voltage level over time. If the word line WL is eventually driven high, then the voltage level of bit bar line BLb will be driven towards ground (i.e., zero), but because the voltage level of bit line BL was diminished by leakage current, it will take longer for the voltage level of bit bar line BLb to decrease enough to generate a sufficient voltage difference between the bit line pair to enable the sense amplifier circuitry to detect the stored bit value. Moreover, if the leakage current in bit line BL is sufficiently greater than any leakage current in bit bar line Blb, then it is possible that the initial voltage difference between the bit line pair will result in the sense amplifier circuitry detecting the wrong stored bit value (i.e., a 0 instead of a 1 in this example).

To address the issue of leakage currents in bit lines, conventional memory array 100 of FIG. 1 is implemented with leakage abatement circuits (LAC) 106 and 106b, where LAC 106 is configured to inject an appropriate amount of current into bit line BL to compensate for leakage current in that bit line, and LAC 106b is configured to inject a (potentially different) appropriate amount of current into bit bar line BLb to compensate for leakage current in that bit line.

SUMMARY

Such leakage abatement circuits 106 and 106b may cause slowdown or failure of memory read operations, in much the same way as having no leakage abatement circuit in bit lines with negligible leakage would. After the word line WL is driven high, the read operation proceeds by sharing charge between the "0" side of the cell and the bit line on that side. The slower the rate of discharge of this bit line, the more time would be needed to lower the pre-charge level on the bit line, resulting in a sense amplifier slowdown or, in the worst case, failure to sense the correct data.

An aspect of the disclosure pertains to an article of manufacture comprising a memory array comprising first and second bit lines, at least one cell, and first and second signal-development circuits. The at least one cell is coupled to the first and second bit lines, wherein a bit value stored in the cell is detectable by sensing a voltage difference developed between the first and second bit lines during a read operation. The first signal-development circuit is coupled to the first bit line to accelerate draining the first bit line of charge during the read operation if a first bit value is stored in the cell, and the second signal-development circuit is coupled to the second bit line to accelerate draining the second bit line of charge during the read operation if a second bit value, different from the first value, is stored in the cell.

An aspect of the disclosure pertains to a method of detecting a bit value stored in a cell of a memory array during a read operation. First and second bit lines coupled to the cell are pre-charged, and a word line, coupled to the cell, is turned on to develop a voltage difference between the first and second bit lines. A first signal-development circuit, coupled to the first bit line, accelerates draining the first bit line of charge during the read operation if a first bit value is stored in the cell, and a second signal-development circuit, coupled to the second bit line, accelerates draining the second bit line of charge during the read operation if a second bit value, different from the first value, is stored in the cell. The bit value is detected by sensing the voltage difference developed between the first and second bit lines.

Another aspect of the disclosure pertains to a non-transitory machine-readable medium that stores configuration data or instructions for causing a machine to execute, or for configuring a machine to execute, or for describing circuitry or machine structures that can execute or otherwise perform a set of actions or accomplish a stated function for manufacturing an article of manufacture comprising a memory array comprising first and second bit lines, at least one cell, and first and second signal-development circuits. The at least one cell is coupled to the first and second bit lines, wherein a bit value stored in the cell is detectable by sensing a voltage difference developed between the first and second bit lines during a read operation. The first signal-development circuit is coupled to the first bit line to accelerate draining the first bit line of charge during the read operation if a first bit value is stored in the cell, and the second signal-development circuit is coupled to the second bit line to accelerate draining the second bit line of charge during the read operation if a second bit value, different from the first value, is stored in the cell.

Another aspect of the disclosure pertains to a method of addressing weak, defective, or potentially defective portions of a memory cell array. In an example, the method includes determining that a bit line pair has a potentially inadequate amount of signal development during a read operation of a memory cell coupled with that bit line pair. The method includes, in response to the determining, enabling a switch or switches that activate read development circuits coupled with that bit line pair. Each of the read development circuits is respectively operational during a read of a cell in the column of memory cells coupled with that bit line pair, in dependence on a value (voltage level) of the cell that is being read during that read operation. A still further aspect of the disclosure pertains to a memory cell array having a plurality of bit line pairs, each bit line pair coupled with a column of memory cells, each column having a plurality of rows, wherein the rows are selectively activated during a read operation. The memory cell array comprises signal development circuits, wherein each signal development circuit is coupled with a respective bit line through a switch element, and a selection of the signal development circuits are active (can drain current from a respective bit line when operated), and others of the signal development circuits are inactive. Such memory cell array also may include non-volatile memory elements that retain configuration data that identifies which of the signal development circuits are active and control the respective switch elements for those signal development circuits.

BRIEF DESCRIPTION OF THE DRAWINGS

Embodiments of the invention will become more fully apparent from the following detailed description, the appended claims, and the accompanying drawings in which like reference numerals identify similar or identical elements.

FIG. 2 is a simplified schematic circuit diagram of a portion of a memory array according to one embodiment of the invention; and FIG. 3 is a schematic circuit diagram of a signal-development circuit that can be used instead of the corresponding signal-development circuits of FIG. 2, according to an alternative embodiment of the invention.

DETAILED DESCRIPTION

Figure 1:
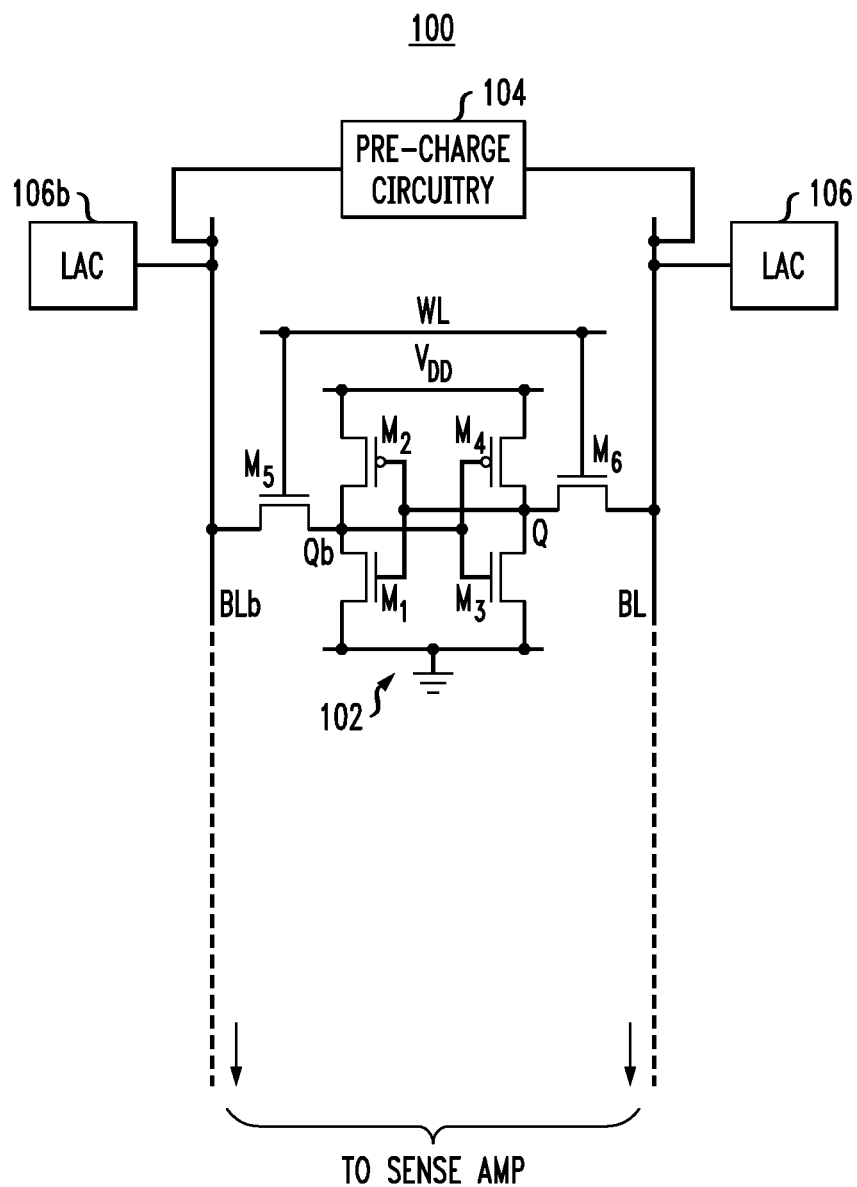
FIG. 1 is a simplified schematic circuit diagram of a portion of a conventional memory array.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

As used herein, the terms "assert" and "de-assert" are used when referring to the rendering of a control signal, status bit, or other relevant functional feature or element into its logical true state and logical false state, respectively. If the logical true state is a voltage level one (i.e., high), then the logical false state is a voltage level zero (i.e., low). Alternatively, if the logical true state is voltage level zero, then the logical false state is voltage level one.

In various alternative embodiments, each logic signal described herein may be generated using positive or negative logic circuitry. For example, in the case of a negative logic signal, the signal is active low, and the logical true state corresponds to a voltage level zero. Alternatively, in the case of a positive logic signal, the signal is active high, and the logical true state corresponds to a voltage level one.

FIG. 2 is a simplified schematic circuit diagram of a portion of a memory array 200, according to one embodiment of the invention, comprising a two-dimensional array of 1-bit SRAM memory cells 202 arranged in rows and columns, of which only one example cell is shown in FIG. 2. Memory array 200 is analogous to memory array 100 of FIG. 1 with analogous elements having analogous labels, and cell 202 is analogous to cell 102 of FIG. 1. The difference between memory array 200 and memory array 100 is the presence of signal-development circuitry in memory array 200. In particular, the signal-development circuitry of memory array 200 comprises signal-development circuit 208 coupled to bit line BL, signal-development circuit 208b coupled to bit bar line BLb, and pulldown devices N3 and N4 respectively coupled to the two signal-development circuits 208 and 208b.

Signal-development circuit 208 comprises pFET (p-type field effect transistor) device P1 and nFET (n-type FET) device N1. Similarly, signal-development circuit 208b comprises pFET device P2 and nFET device N2. For a read operation, if bit lines BL and BLb are both driven high during the initial pre-charge phase, then devices P1, N1, P2, and N2 will all be turned off.

If cell 202 stores a bit value of 1, such that Q is high and Qb is low, if word line WL is eventually driven high, thereby turning on device M6, then bit line BL stays high due to turned-on M4 and M6, which keeps devices P1 and N1 of signal-development circuit 208 off. However, at the same time, driving word line WL high turns on device M5, which starts to drive bit bar line BLb low through turned-on M5 and M1. Driving bit bar line BLb low starts to turn on device P2 of signal-development circuit 208b, which in turn starts to turn on device N2 of signal-development circuit 208b, which assists in driving bit bar line BLb low even faster and thus develops a voltage difference between the bit line pair of sufficient magnitude even faster. As such, if cell 202 stores a bit value of 1, then the presence of signal-development circuit 208b speeds up the read operation. Note that this will be true even if a leakage abatement circuit, such as LAC 206b, is injecting current into bit bar line BLb. Note further that the presence of signal-development circuit 208 has no effect on the speed of the read operation if cell 202 stores a bit value of 1.

If, on the other hand, cell 202 stores a bit value of 0, such that Q is low and Qb is high, if word line WL is eventually driven high, thereby turning on device M5, then bit bar line BLb stays high due to turned-on M5 and M2, which keeps devices P2 and N2 of signal-development circuit 208b off. However, at the same time, driving word line WL high turns on device M6, which starts to drive bit line BL low through turned-on M6 and M3. Driving bit line BL low starts to turn on device P1 of signal-development circuit 208, which in turn starts to turn on device N1 of signal-development circuit 208, which assists in driving bit line BL low even faster and thus develops a voltage difference between the bit line pair of sufficient magnitude even faster. As such, if cell 202 stores a bit value of 0, then the presence of signal-development circuit 208 speeds up the read operation. Note that this will be true even if a leakage abatement circuit, such as LAC 206, is injecting current into bit line BL. Note further that the presence of signal-development circuit 208b has no effect on the speed of the read operation if cell 202 stores a bit value of 0.

Pulldown devices N3 and N4 are nFET transistors that ensure that the discharge paths of the pair of bit lines BL and BLb through transistors N1 and N2 are off during the pre-charge phase, so that the pre-charge level is maintained on the bit lines.

Thus, during the pre-charge phase, the control signal PRECHARGE from the pre-charge circuitry 204 is asserted high, pulldown devices N3 and N4 are on, which ensures that devices P1, N1, P2, and N2 are all off during the pre-charge phase. At the end of the pre-charge phase, the PRECHARGE signal is de-asserted, and pulldown devices N3 and N4 are turned off. Turning off pulldown devices N3 and N4, enables either (i) P2 and N2 of signal-development circuit 208b to be turned on (i.e., if cell 202 stores a value of 1) or (ii) P1 and N1 of signal-development circuit 208 to be turned on (i.e., if cell 202 stores a value of 0). Signal-development circuits 208 and 208b and pulldown devices N3 and N4 improve the signal development during read operations by allowing the bit line adjacent to the "0" side of the cell 202 to start discharging slightly before the bit line adjacent to the "1" side of the cell 202. The invention relies on the premise that the discharge path through the "0" side of the cell 202 during a read operation is a stronger discharge path than the leakage path through the unselected memory cells on the other side.

FIG. 3 is a schematic circuit diagram of a signal-development circuit 308 that can be used instead of signal-development circuit 208 of FIG. 2 in memory array 202, according to an alternative embodiment of the invention. Signal-development circuit 308 is similar to signal-development circuit 208 except that signal-development circuit 308 also has an nFET switch device SW1 coupled to an anti-fuse device F1. Depending on the implementation, switch device SW1 may be, for example, a one-time programmable (OTP) switch or an SRAM-based "soft" anti-fuse device. Alternative designs with appropriate changes in transistor type may employ fuse devices instead of anti-fuse devices.

Before anti-fuse device F1 is blown, the voltage applied to the gate of SW1 is low, switch device SW1 is off, and signal-development circuit 308 is disabled. After anti-fuse device F1 is blown, the voltage applied to the gate of SW1 is (permanently) high, switch device SW1 is (permanently) on, and signal-development circuit 308 is enabled. Although not shown in the figures, signal-development circuit 208b of FIG. 2 can also be replaced by a signal-development circuit analogous to signal-development circuit 308 of FIG. 3 having an analogous switch device coupled to an analogous anti-fuse device.

The presence of the switch devices (e.g., SW1 of FIG. 3) in the signal-development circuits (e.g., 208 of FIG. 2) enables the signal-development circuits to be selectively enabled only for those relatively weak bit-line pairs that require the signal development provided by those circuits. During testing, it is determined which bit lines or sense amps are weak, and then the weak bit lines are repaired. The repair flow usually consists of applying soft fuses during wafer-level test, and then blowing actual fuse bits (such as E-Fuse) or anti-fuse devices during assembly and final test. During final test, the packaged device would be tested again to determine if the weak bit lines got repaired.

Although the invention has been described in the context of memory arrays having a different leakage abatement circuit for each bit line, the invention can also be implemented in the context of memory arrays having a single leakage abatement circuit for each array column that is coupled to both bit lines or to only one bit line and/or memory arrays having no leakage abatement circuits.

If the bit lines have low leakage and there are no leakage abatement circuits, then signal-development circuits of the present invention can improve read signal-development time and can improve yield (i.e., by preventing read failure) or read performance. If the bit lines have low leakage and there are leakage abatement circuits, then signal-development circuits of the present invention can improve read signal-development time by weakening the effect of leakage abatement on the "0" side of the cell that is being sensed, by discharging some of the extra abatement current through the NMOS discharge path attached to the bit line coupled to the "0" side of the cell. If the bit lines have high leakage and there are leakage abatement circuits, then signal-development circuits of the present invention can enhance the leakage abatement circuits to improve the read performance and prevent read failures by increasing the rate at which the bit line coupled to the "0" side of the cell discharges. If the bit lines have high leakage and there are no leakage abatement circuits, then signal-development circuits of the present invention can improve the rate at which signal develops across the bit-line pair during the sense phase, by speeding up the discharge of the bit line on the "0" side of the cell.

Although the invention has been described in the context of memory arrays comprising 1-bit SRAM cells having a particular six-transistor configuration, the invention can also be implemented in the context of memory arrays comprising SRAM cells having other configurations with the same or other numbers of transistors as well as memory arrays comprising other types of volatile or non-volatile memory cells.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device if an embodiment of the invention is implemented using bi-polar transistor technology.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, if configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nano-tubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine-readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. If used with the open-ended term "comprising," then the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An article of manufacture comprising a memory array comprising:
    first and second bit lines;
    at least one cell coupled to the first and second bit lines, wherein a bit value stored in the cell is detectable by sensing a voltage difference developed between the first and second bit lines during a read operation;
    a first signal-development circuit coupled to the first bit line to accelerate draining the first bit line of charge during the read operation if a first bit value is stored in the cell; and
    a second signal-development circuit coupled to the second bit line to accelerate draining the second bit line of charge during the read operation if a second bit value, different from the first value, is stored in the cell, wherein each signal-development circuit comprises:
    a p-type device comprising a gate coupled to the corresponding bit line and a source coupled to a voltage supply; and an n-type device comprising a gate coupled to the drain of the p-type device, a source coupled to a ground, and a drain coupled to the corresponding bit line.

2. The article of claim 1, wherein:
    the at least one cell is one of a plurality of SRAM cells in a column in the memory array;
    the first and second bit lines are coupled to sense amplifier circuitry configured to detect the voltage difference between the first and second bit lines during the read operation; and
    the column is one of a plurality of columns in the memory array, each column having its own first and second bit lines.

3. The article of claim 1, wherein each signal-development circuit further comprises:
    an n-type switch device comprising a gate coupled to an anti-fuse device and a channel coupled between the drain of the n-type device and the ground.

4. The article of claim 1, wherein:
    the cell is one of a plurality of SRAM cells in a column in the memory array;
    the first and second bit lines are coupled to sense amplifier circuitry configured to detect the voltage difference between the first and second bit lines during the read operation;
    the column is one of a plurality of columns in the memory array, each column having its own first and second bit lines;
    and
    the memory array further comprises first and second n-type pulldown devices controlled by a control signal indicative of the pre-charge phase for the memory array, wherein:
        the channel of the first n-type pulldown device is coupled between the first signal-development circuit and a ground; and
        the channel of the second n-type pulldown device is coupled between the second signal-development circuit and the ground.

5. The article of claim 4, wherein each signal-development circuit further comprises an n-type switch device comprising a gate coupled to an anti-fuse device and a channel coupled between the drain of the n-type device and the ground.

6. The article of claim 4, wherein each of the first and second bit lines is coupled to a leakage abatement circuit configured to inject current into the bit line to compensate for leakage current in the bit line.

7. An article of manufacture comprising a memory array comprising:
    first and second bit lines;
    at least one cell coupled to the first and second bit lines, wherein a bit value stored in the cell is detectable by sensing a voltage difference developed between the first and second bit lines during a read operation;
    a first signal-development circuit coupled to the first bit line to accelerate draining the first bit line of charge during the read operation if a first bit value is stored in the cell,
    a second signal-development circuit coupled to the second bit line to accelerate draining the second bit line of charge during the read operation if a second bit value, different from the first value, is stored in the cell, wherein:
a channel of a first n-type pulldown device is coupled between the first signal-development circuit and a ground; and
a channel of a second n-type pulldown device is coupled the between second signal-development circuit and a ground.

8. An article of manufacture comprising a memory array comprising:
first and second bit lines;
at least one cell coupled to the first and second bit lines, wherein a bit value stored in the cell is detectable by sensing a voltage difference developed between the first and second bit lines during a read operation;
a first signal-development circuit coupled to the first bit line to accelerate draining the first bit line of charge during the read operation if a first bit value is stored in the cell; and
a second signal-development circuit coupled to the second bit line to accelerate draining the second bit line of charge during the read operation if a second bit value, different from the first value, is stored in the cell, wherein at least one bit line of the first and second bit lines is coupled to a leakage abatement circuit configured to inject current into the at least one bit line to compensate for leakage current in the at least one bit line.

9. The article of claim 8, wherein each of the first and second bit lines is coupled to a leakage abatement circuit configured to inject current into the bit line to compensate for leakage current in the bit line.

10. A method of detecting a bit value stored in a cell of a memory array during a read operation, the method comprising:
pre-charging first and second bit lines coupled to the cell;
turning on a word line coupled to the cell;
draining charge, by a first signal-development circuit coupled to the first bit line, during the read operation, in response to a first bit value being stored in the cell;
draining charge, by a second signal-development circuit coupled to the second bit line, during the read operation, in response to a second bit value, different from the first bit value, being stored in the cell; and
detecting the bit value by sensing a voltage difference developed between the first and second bit lines, wherein draining charge by each signal-development circuit comprises:
turning on a p-type device comprising a gate coupled to the corresponding bit line and a source coupled to a voltage supply; and turning on an n-type device comprising a gate coupled to the drain of the p-type device, a source coupled to a ground, and a drain coupled to the corresponding bit line.

11. The method of claim 10, wherein draining charge by each signal-development circuit further comprises:
controlling, with an anti-fuse device, a voltage applied to a gate of an n-type switch device to turn on the n-type switch device comprising a channel coupled between the drain of the n-type device and the ground, wherein the anti-fuse device is selectively blown during testing that were found to have weak signal development.

12. A non-transitory machine-readable medium that stores data describing circuitry comprising a memory array comprising:
first and second bit lines;
at least one cell coupled to the first and second bit lines, wherein a bit value stored in the cell is detectable by sensing a voltage difference developed between the first and second bit lines during a read operation;
a first signal-development circuit coupled to the first bit line to accelerate draining the first bit line of charge during the read operation if a first bit value is stored in the cell; and
a second signal-development circuit coupled to the second bit line to accelerate draining the second bit line of charge during the read operation if a second bit value, different from the first value, is stored in the cell, wherein at least one bit line of the first and second bit lines is coupled to a leakage abatement circuit configured to inject current into the at least one bit line to compensate for leakage current in the at least one bit line.

13. The non-transitory machine-readable medium of claim 12, wherein the stored data describes circuitry wherein:
the cell is one of a plurality of SRAM cells in a column in the memory array;
the first and second bit lines are coupled to sense amplifier circuitry configured to detect the voltage difference between the first and second bit lines during the read operation;
the column is one of a plurality of columns in the memory array, each column having its own first and second bit lines;
the memory array further comprises first and second n-type pulldown devices controlled by a control signal indicative of the pre-charge phase for the memory array, wherein:
the channel of the first n-type pulldown device is coupled between the first signal-development circuit and a ground; and
the channel of the second n-type pulldown device is coupled between the second signal-development circuit and the ground.

14. The non-transitory machine-readable medium of claim 12, wherein the stored data describes circuitry wherein each signal-development circuit further comprises an n-type switch device comprising a gate coupled to an anti-fuse device and a channel coupled between the drain of the n-type device and the ground.

* * * * *